United States Patent
Furukawa et al.

(10) Patent No.: US 6,447,600 B1
(45) Date of Patent: Sep. 10, 2002

(54) METHOD OF REMOVING DEFECTS OF SINGLE CRYSTAL MATERIAL AND SINGLE CRYSTAL MATERIAL FROM WHICH DEFECTS ARE REMOVED BY THE METHOD

(75) Inventors: Jun Furukawa; Mitsuru Sudou; Tetsuya Nakai, all of Saitama; Takao Fujikawa; Takuya Masui, both of Hyogo, all of (JP)

(73) Assignee: Mitsubishi Materials Silicon Corporation, Tokyo (JP)

( * ) Notice: Subject to any disclaimer, the term of this patent is extended or adjusted under 35 U.S.C. 154(b) by 0 days.

(21) Appl. No.: 09/806,550
(22) PCT Filed: Sep. 29, 1999
(86) PCT No.: PCT/JP99/05310
§ 371 (c)(1),
(2), (4) Date: Mar. 30, 2001
(87) PCT Pub. No.: WO00/18990
PCT Pub. Date: Apr. 6, 2000

(30) Foreign Application Priority Data

Sep. 30, 1998 (JP) .............................................. 10-277004
Mar. 26, 1999 (JP) .............................................. 11-82953

(51) Int. Cl.$^7$ .............................................. C30B 25/02
(52) U.S. Cl. ................... 117/2; 117/11; 117/84
(58) Field of Search .................. 117/2, 11, 84

(56) References Cited

U.S. PATENT DOCUMENTS 5,558,815 A * 9/1996 Yokota ................... 252/301.45
6,036,776 A * 3/2000 Kotooka et al. ............ 117/217

FOREIGN PATENT DOCUMENTS

JP 59-184533 10/1984
JP 04-295100 10/1992

* cited by examiner

Primary Examiner—Felisa Hiteshew
(74) Attorney, Agent, or Firm—Reed Smith LLP

(57) ABSTRACT

A hot isostatic pressing treatment is conducted for a single crystal body (11) in an atmosphere where the single crystal body (11) is stable, under a pressure of 0.2 to 304 MPa at a temperature which is 0.85 or more times the melting point in an absolute temperature unit of the single crystal body (11), for 5 minutes to 20 hours; and the single crystal body (11) is annealed. It is preferable that the atmosphere where the single crystal body (11) is stable is an inert gas atmosphere or an atmosphere containing vapor of a high vapor pressure element, and it is more preferable that the HIP treatment is conducted under a pressure of 10 to 200 MPa. Further, the single crystal body (11) may be an ingot of a silicon single crystal, a GaAs single crystal, an InP single crystal, a ZnS single crystal or a ZnSe single crystal, or a block or wafer obtained by slicing the ingot. In this way, there are expelled or dispersed those lattice defects such as vacancy type grown-in defects existing not only at the surface but also at the interior of the single crystal body (11), irrespectively of the size of the single crystal body (11).

14 Claims, 4 Drawing Sheets

METHOD OF REMOVING DEFECTS OF SINGLE CRYSTAL MATERIAL AND SINGLE CRYSTAL MATERIAL FROM WHICH DEFECTS ARE REMOVED BY THE METHOD

This application claims priority of Japanese Application Nos. Hei 10-277004 filed Sep. 30, 1998 and Hei 11-082953 filed Mar. 26, 1999 and International Application No. PCT/JP99/05310 filed Sep. 29, 1999, the complete disclosure of which are hereby incorporated by reference.

TECHNICAL FIELD

The present invention relates to production of a single crystal body of a high quality silicon (hereafter called "single crystal body") such as used for substrates of integrated circuits or devices to be used in the electronics field. More particularly, the present invention relates to a technique for conducting a distinctive treatment after producing a single crystal body by a conventional single crystal producing method, to thereby eliminate those lattice defects at a lattice defect level, which defects have been caused during the growth of the single crystal body.

BACKGROUND ART

Recent advancement of electronic and communication devices has been largely promoted by the advancement of the main technique of large-scale integrated circuit (LSI). LSI's are typically produced such as by forming devices and wiring films on a surface of a semiconductor single crystal wafer having a diameter of about 8 inches, by combining various deposition methods such as an ion implantation method with an etching method, and by slicing the wafer into individual LSI's. The reliability of the produced LSI's and the yield of products are largely affected by the defects caused during the production process.

Particularly, single crystal wafers act as a so-called basis of LSI's. Existence of lattice defects in a single crystal wafer leads to sinks of donors and acceptors, for example, thereby problematically resulting in so-called defective electrical characteristics of semiconductors. For example, as a factor affecting on the electrical characteristics of LSI's, it is known that grown-in defects caused by point defects (such as interstitial silicon atoms, and vacancies) exist in silicon single crystal wafers produced by a Czochralski method (hereinafter called "CZ method") or a floating zone method (hereinafter called "FZ method"). Grown-in defects include a vacancy type and an interstitial silicon type, due to differences between growth conditions.

As a method for reducing such vacancy type grown-in defects, there has been disclosed a producing method of a semiconductor substrate comprising the steps of: heat treating a silicon single crystal wafer at 723 to 1173 K (absolute temperature) for 0.5 to 16 hours to thereby generate oxygen precipitations within the single crystal wafer; and heat treating the single crystal wafer at high temperatures higher than 1273 K (absolute temperature) for 5 minutes to 5 hours within a hydrogen gas or a hydrogen containing inert gas (see Japanese Examined Patent Publication HEI-5-18254 (18254/1993)). According to this method, there are reduced those grown-in defects of a vacancy type existing near the single crystal wafer surface which becomes an active layer of an LSI.

Among grown-in defects, vacancy type defects tend to be caused by an increased pulling-up speed in a CZ method. Thus, the pulling-up speed is reduced to avoid such vacancy type grown-in defects.

However, according to the method disclosed by the aforementioned Japanese Examined Patent Publication HEI-5-18254, although those vacancy type grown-in defects near the single crystal wafer surface can be reduced, it is difficult to reduce vacancy type grown-in defects in the region interior of the wafer surface. Further, the reduced pulling-up speed in the CZ method so as to reduce the vacancy type grown-in defects leads to such problems of generation of interstitial silicon type grown-in defects and of deteriorated productivity of silicon single crystal.

Moreover, although increased diameters (of 12 inches) of silicon single crystal wafers are increasingly demanded recently so as to achieve a higher degree of integration of an LSI itself as well as a reduced cost such as at the deposition process. However, as the diameters are increased, the defect control and quality control in the production process become difficult and cause a problem of an increased production cost.

It is therefore an object of the present invention to provide a HIP treatment method of a single crystal body, capable of expelling (or filling up) or dispersing those lattice defects such as vacancy type grown-in defects existing not only at the surface of the single crystal body but also within the single crystal body, irrespectively of the size of the single crystal body.

It is another object of the present invention to provide a single crystal body, which is free of lattice defects such as vacancy type grown-in defects at the surface and interior of the single crystal body, or in which such lattice defects are extremely less and so fine.

DISCLOSURE OF THE INVENTION

Concerning the aforementioned conventional problems of defect generation in production of semiconductor single crystals, the present inventors have found that lattice defects or agglomerates of lattice defects inevitably caused during production of the semiconductor single crystals by the conventional single crystal producing method can be eliminated, by conducting a hot isostatic pressing treatment (hereinafter called "HIP treatment"), and have narrowly carried out the present invention.

The invention according to claim 1 is a defect eliminating method of a single crystal body, comprising the steps of: conducting a hot isostatic pressing treatment for a single crystal body 11 in an atmosphere where the single crystal body 11 is stable, under a pressure of 0.2 to 304 MPa at a temperature which is 0.85 or more times the melting point in an absolute temperature unit of the single crystal body 11, for 5 minutes to 20 hours; and annealing the single crystal body 11, as shown in FIG. 1.

As lattice defects formed within a single crystal body, there are known: an atomic vacancy and an interstitial atom, which are defects at a unit atom level; a dislocation and a stacking fault, which are defects like lattice disorders; and any combination thereof, such as a relatively large hole (piled-up vacancy) formed by agglomerated atomic vacancies. Among them, dislocations and piled-up vacancies are particularly problematic, in using a single crystal body as a semiconductor substrate. Less amounts of atomic vacancies and interstitial atoms are not individually problematic, since each of them is far smaller than dimensions of device and wiring of LSI's today. Concerning stacking faults, dislocations tend to occur at the boundaries of stacking faults, and occurrence of dislocations leads to a problem. These problematic lattice defects cause such a phenomenon that only these defect portions are selectively etched such as by an etching operation of an LSI production process, thereby affectingly lowering a yield of the production process and thus lowering the reliability of the final product.

The present inventors have conducted numerous experiments concerning methods for treating silicon single crystals including such lattice defects in various inert gas atmospheres (such as Ar gas) at high temperatures under high pressures, and found that the HIP treatment and the annealing thereafter under the specific conditions as recited in claim 1 have an effect to eliminate the aforementioned lattice defects or disperse the lattice defects into a lattice defect state at a unit atom level, to thereby substantially exclude those lattice defects of sizes which are problematic in practical use. Namely, the HIP treatment of a single crystal body results in that those lattice defects such as vacancy type grown-in defects existing within the single crystal wafer are crushed, such that those atoms constituting the single crystal body are re-arranged, to thereby provide a high quality single crystal body in which the lattice defects such as vacancy type grown-in defects are expelled or dispersed.

It is preferable that the HIP treatment atmosphere where the single crystal body is stable is an inert gas atmosphere or an atmosphere containing vapor of a high vapor pressure element, and it is more preferable that the HIP treatment is conducted under a pressure of 10 to 200 MPa.

Further, the single crystal may be an ingot of a silicon single crystal, or a block or wafer obtained by slicing the ingot.

Moreover, the single crystal body which is defect-eliminated by the method recited in anyone of claims 1 through 4 results in a high quality single crystal body in which the lattice defects such as vacancy type grown-in defects are expelled or dispersed.

BRIEF DESCRIPTION OF THE DRAWINGS

FIG. 5-B is a view schematically showing the silicon single crystal wafer of the Example 1, after the implantation of He ions and before an anneal treatment;

FIG. 5-C is a view schematically showing the silicon single crystal wafer of the Example 1, after the anneal treatment and before a HIP treatment;

FIG. 5-D is a view schematically showing the silicon single crystal wafer of the Example 1, after the HIP treatment;

FIG. 6-B is an electron micrograph (about×18,000) of the cross section of the silicon single crystal wafer of the Example 1 after the anneal treatment and before the HIP treatment;

FIG. 6-C is an electron micrograph (about×45,000) of the cross section of the silicon single crystal wafer of the Example 1 after the anneal treatment and before the HIP treatment; and FIG. 6-D is an electron micrograph (about×18,000) of the cross section of the silicon single crystal wafer of the Example 1 after the HIP treatment.

BEST MODE FOR CARRYING OUT THE INVENTION

There will be described hereinafter a first embodiment of the present invention, with reference to the accompanying drawings.

Figure 1:
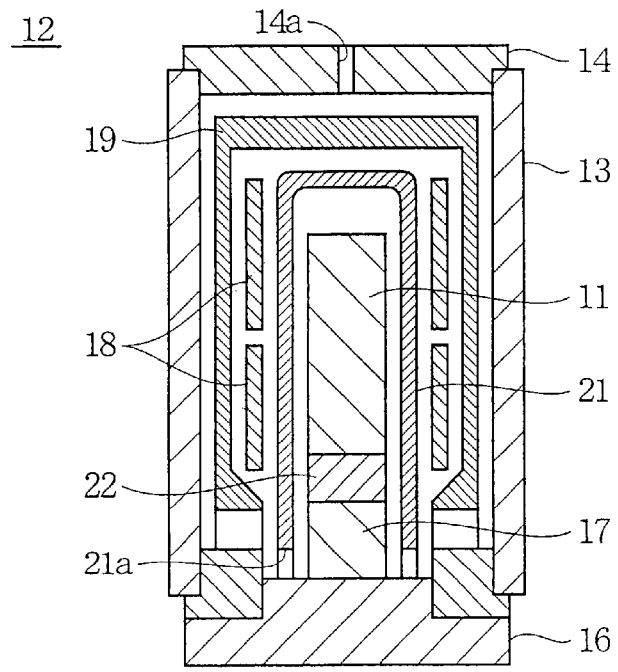
FIG. 1 is a longitudinal cross-sectional view of a HIP apparatus according to the present invention to be used for eliminating defects of a single crystal body.
Figure 2:
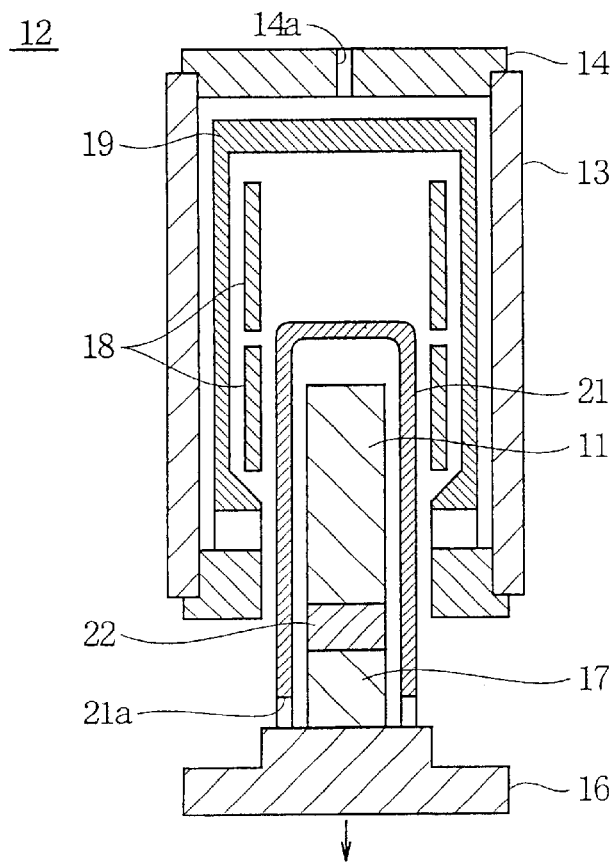
FIG. 2 is a cross-sectional view corresponding to FIG. 1, showing a state where a lower lid is being lowered so as to take out the single crystal body from the HIP apparatus.

As shown in FIGS. 1 and 2, the defect elimination from a single crystal body 11 of the present invention is conducted by a hot isostatic pressing apparatus (hereinafter called "HIP apparatus") 12. The HIP apparatus 12 comprises: a cylindrical pressure vessel 13 resistant to high temperatures and high pressures; an upper lid 14 and a lower lid 16 for closing the upper end and lower end of the pressure vessel 13, respectively; a support 17 placed on an upper surface of the lower lid 16 so as to carry the single crystal body 11; and a heater 18 for enclosing the outer periphery of the single crystal body 11 at a predetermined spacing and for heating the body 11. Formed at the center of the upper lid 14 is a gas inlet 14a for introducing a gas into the apparatus 12. The lower lid 16 is raised and lowered together with the support 17 and single crystal body 11, and is constituted such that the single crystal body 11 can be loaded onto and unloaded from the support 17 in the lowered condition of the lower lid 16. Reference numeral 19 in FIGS. 1 and 2 designates a heat insulating sleeve enclosing the outer periphery of the heater 18 at a predetermined spacing.

In conducting the HIP treatment by housing the single crystal body 11 in the HIP apparatus 12: the interior of the HIP apparatus 12 is filled with a stable atmosphere for the single crystal body 11; the pressure within the apparatus 12 is raised to 0.2 to 304 MPa, and preferably 10 to 200 MPa; the temperature within the apparatus 12 is brought to a temperature 0.85 or more times, preferably 0.9 or more times, the melting point of the single crystal body, in an absolute temperature unit; and the period of time for maintaining this state is set at 5 minutes to 20 hours, preferably 0.5 hours to 5 hours (in case that the treatment temperature is set at a temperature 0.9 times or more of the melting point). Further, the single crystal body 11 is naturally cooled, i.e., annealed.

Preferably, the stable atmosphere for the single crystal body 11 during the HIP treatment is an inert gas atmosphere or an atmosphere containing vapor of a high vapor pressure element. Since the single crystal body 11 consists of a single element and the vapor pressure is not so raised, it is possible to use an inert gas such as an argon gas as a pressure medium. However, it is necessary to pay attention to contamination of the single crystal body 11, such as by introduction of air into the HIP apparatus 12 when the single crystal body 11 is introduced into the apparatus 12, and by volatilization of constituent parts of the apparatus 12 such as the heater 18 and volatilization of adsorbates. Concretely, it is preferable to conduct the HIP treatment in such a state that the single crystal body 11 is housed within a container 21 of an inverted bowl shape which is formed of a gas impermeable material and has an opening part 21a for pressure equalization at the lower portion of the HIP apparatus 12. Further, since a high pressure gas is a fluid having a high density and a low viscosity and thus tends to cause convection, it becomes possible to suppress contamination such as due to substances volatilized from constituent parts of the HIP apparatus 12 such as the heater 18, by housing the single crystal body 11 within the container 21. Further, it is preferable to place a block 22 made of pure titanium between the support 17 and single crystal body 11, so as to getter such as oxygens within the container 21 when heated to a high temperature.

The temperature definition upon HIP treatment to 0.85 times the melting point of the single crystal body in an absolute temperature unit is to promote dispersion of lattice defects within the single crystal body. Further, the pressure definition upon HIP treatment to 0.2 to 304 MPa is due to the fact that: pressures lower than 0.2 MPa fail to lead to an expelling effect or a dispersion effect of the lattice defects; and pressures exceeding 304 MPa cause a problem of strength of the HIP apparatus, though higher pressures further promote the progress of dispersion of the lattice defects. From a practical point of view, pressures of 200 MPa or less are suitable. Further, the definition of the HIP treatment time to 5 minutes to 20 hours is due to the fact that: time periods shorter than 5 minutes lead to insufficient progress of dispersion of the lattice defects; and time periods exceeding 20 hours hinder the productivity since the HIP treatment time exceeds 24 hours inclusive of the annealing time. Considering that the HIP treatment is to be conducted so as to keep the HIP treatment time within 24 hours, it is preferable to conduct it at high temperatures which are 0.9 or more times the melting point of the single crystal body in an absolute temperature unit.

Meanwhile, the single crystal body may be in a state of: a single crystal ingot grown in the CZ method or FZ method; a block obtained by appropriately slicing such an ingot; or a wafer approximating a final product. In case of a small sized single crystal body, it is possible to essentially eliminate lattice defects, since a part of lattice defects is exiled to the outside from the surface of the single crystal. In case of a large sized single crystal body, most of lattice defects are brought into a dispersed state of atomic vacancies over the whole region of the large sized single crystal, to thereby seemingly exhibit a defect-free state sufficient for practical use. Note, it is inappropriate to use the thus obtained single crystal body in such a process where the single crystal body is heated up to a temperature causing agglomeration of the dispersed atomic vacancies, since the state, where the dispersed atomic vacancies agglomerate to form piled-up vacancies, is thermodynamically stable when the single crystal body is heated again near the atmospheric pressure. Temperatures at which the dispersed atomic vacancies agglomerate are included in a range higher than the temperature which is 0.9 times the melting point of the single crystal body, in an absolute temperature unit.

There will be now described the mechanism of the defect elimination according to the aforementioned HIP treatment.

Figure 3:
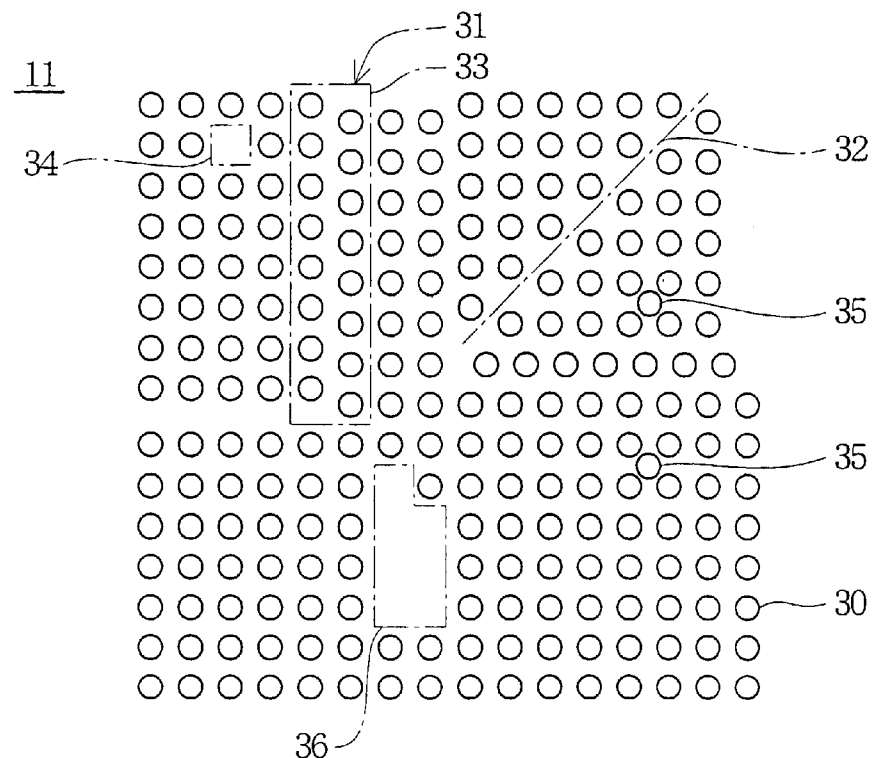
FIG. 3 is a view schematically showing a structure of a single crystal body consisting of a single element produced by a typical single crystal producing method.

FIG. 3 is a view schematically showing a structure of a single crystal body consisting of a single element produced by a typical single crystal producing method. Although dimensionally exaggerated, there exist several types of defects 32 to 36 generally referred to as lattice defects 31 within the single crystal body 11. While these defects are caused by several factors, the dislocation 32 is said to be caused by a thermal stress due to a temperature difference caused in an ingot during the temperature-falling process after growth of the single crystal body 11 from a melt. The stacking fault 33 is said to be due to impurity elements within the melt or due to a slippage caused upon integration of those agglomerates of atoms 30 called a "cluster" with the single crystal matrix which agglomerates have been formed by atoms 30 upon growth of the single crystal. Further, the atomic vacancy 34 and interstitial atom 35 necessarily exist due to such a natural law that the existence of these defects at specific concentrations, respectively, is thermodynamically stable under a condition at a predetermined temperature higher than the absolute zero point and at a predetermined pressure, unless the single crystal growth is conducted with a specific temperature gradient. Note, reference numeral 36 in FIG. 3 designates a piled-up vacancy.

Concerning the stability and the like of the aforementioned lattice defects 31, there exist: a thermodynamic law that every substance is thermodynamically stable at a high pressure if it takes a structure occupying a smaller volume than at the atmospheric pressure; and a hypothesis that the transition (dispersion phenomenon of atoms) of a substance to such an energetically stable smaller volume condition tends to be accelerated at a high pressure. Applying this consideration to defects of a single crystal body, certain types of lattice defects will be probably expelled or dispersed to thereby cause a volume reduction. It has been already pointed out that such a phenomenon is caused in a range above 1 GPa which is a so-called solid pressure range. However, it is impossible to treat a single crystal body of a large volume in such a high pressure range, and industrial usage is impossible. Further, in case of the solid pressure, there is used a pressure medium such as a powder of solid, thereby inevitably causing a shearing stress due to friction accompanying to transmission of pressure. Such a shearing stress inevitably increases the amount of dislocations, so that the solid pressure is inappropriate for treating a single crystal body such as a subject material of the present invention. One of the advantages of the present invention resides in that a gas pressure is used to realize such a hydrostatic pressure condition at an industrial level, which can suppress an occurrence of the aforementioned shearing stress as less as possible.

Figure 4:
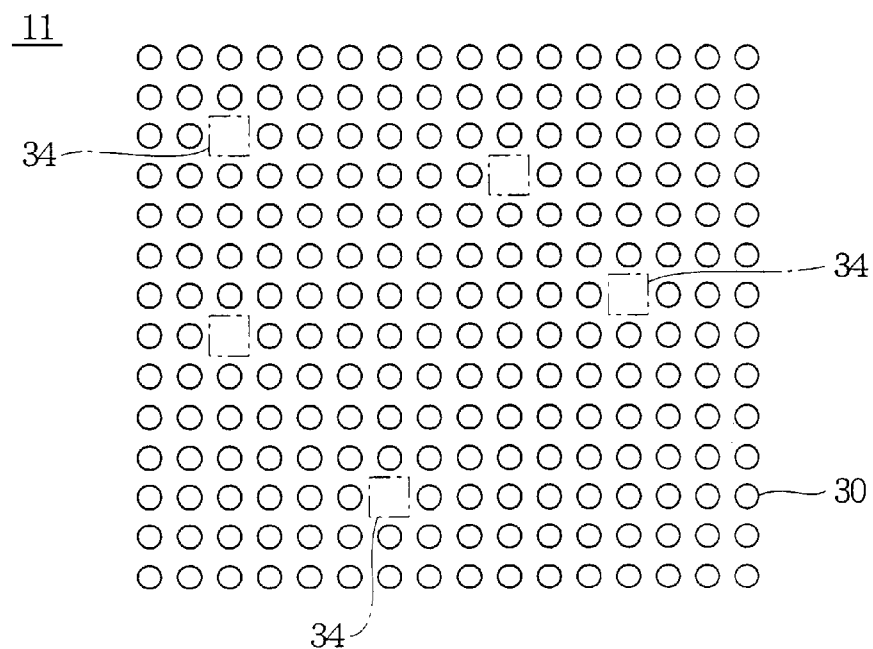
FIG. 4 is a view schematically showing a structure of a single crystal body consisting of a single element after the treatment by the defect eliminating method according to the present invention, i.e., after the HIP treatment.

Since a silicon crystal consisting of a single element, the HIP treatment qualitatively causes the following transitions (1) through (5) of defects, resulting in a reduction of the total amount of the problematic defects. Note, although atomic vacancies are certainly lattice defects, the less amount thereof is not a practical defect as mentioned above. As a result, the crystal lattice of the single crystal after the HIP treatment exhibits such a state as schematically shown in FIG. 4. Namely, there is provided such a structure that the atomic vacancies 34 independently exist within the single crystal body 11 at distances which noway affect one anther.

(1) Edge dislocations (linearly existing on a specific crystal plane) are shifted in a direction to reduce voids at dislocation portions, and the amount thereof is reduced.

(2) Screw dislocations (spiral existence of plane displacement) are not so reduced.

(3) Displacement of stacking faults in a crystal orientation (111) is corrected, and the amount of the stacking faults is reduced.

(4) Interstitial atoms become unstable and move into atomic vacancies since those lattices at interstitial atoms are stretched, resulting in a reduction of the total amount of interstitial atoms.

(5) Piled-up vacancies are unstable if they exist as large holes. Thus, leaving piled-up vacancies at high temperatures for a long period of time results in dispersion of the piled-up vacancies as atomic vacancies, thus results in seeming inexistence of piled-up vacancies.

There will be now described a second embodiment of the present invention.

As a single crystal body in this embodiment, there is adopted a single crystal wafer which is sliced out from a single crystal ingot grown by a CZ method or FZ method. Preferably, the single crystal wafer is not polished yet.

Vacancy type grown-in defects to be reduced by the HIP treatment of the present invention include COP (crystal-originated particles), FPD (flow pattern defect), and LSTD (infrared light scattering tomograph defect). Here, "COP" means crystal-caused shallow etch pits counted as particles by a laser particle counter after SC-1 cleaning. Further, "FPD" means sources of traces exhibiting a unique flow pattern which appears when chemically etching that silicon single crystal wafer by a Secco etching solution for 30 minutes, which wafer has been sliced out from a silicon single crystal lifted by a CZ method. Moreover, "LSTD" is called an infrared light scattering defect, and means origins which have refractive indices different from that of silicon and which generate scattered light when infrared light is irradiated into a silicon single crystal.

The HIP treatment of the present invention is conducted in an atmosphere of an inert gas such as Ar, under a pressure of 0.2 to 304 MPa at a temperature 0.85 or more times the melting point of a single crystal wafer (in an absolute temperature unit) for 5 minutes to 20 hours. When the single crystal wafer is a silicon single crystal wafer, the treatment is preferably conducted under a pressure of 0.5 to 101.3 MPa at a temperature of 1,436 to 1,673 K (absolute temperature) for 0.5 to 5 hours. Pressures, temperatures and time periods below the respective lower limit values fail to provide an effect to expel or reduce vacancy type grown-in defects within the single crystal wafer, while those exceeding the respective upper limit values lead to substantially unchanged reduction degrees. Thus, the aforementioned ranges have been settled from the standpoint of durability of the HIP treatment apparatus.

Note, "reduction of vacancy type grown-in defects" means not only the reduction of sizes of voids formed by aggregated vacancies but also the reduction of the density of voids.

There will be detailed hereinafter examples of the present invention, together with comparative examples.

EXAMPLE 1

In this example, void defects were simulatively formed in a silicon single crystal wafer, and HIP treated.

Figure 5:
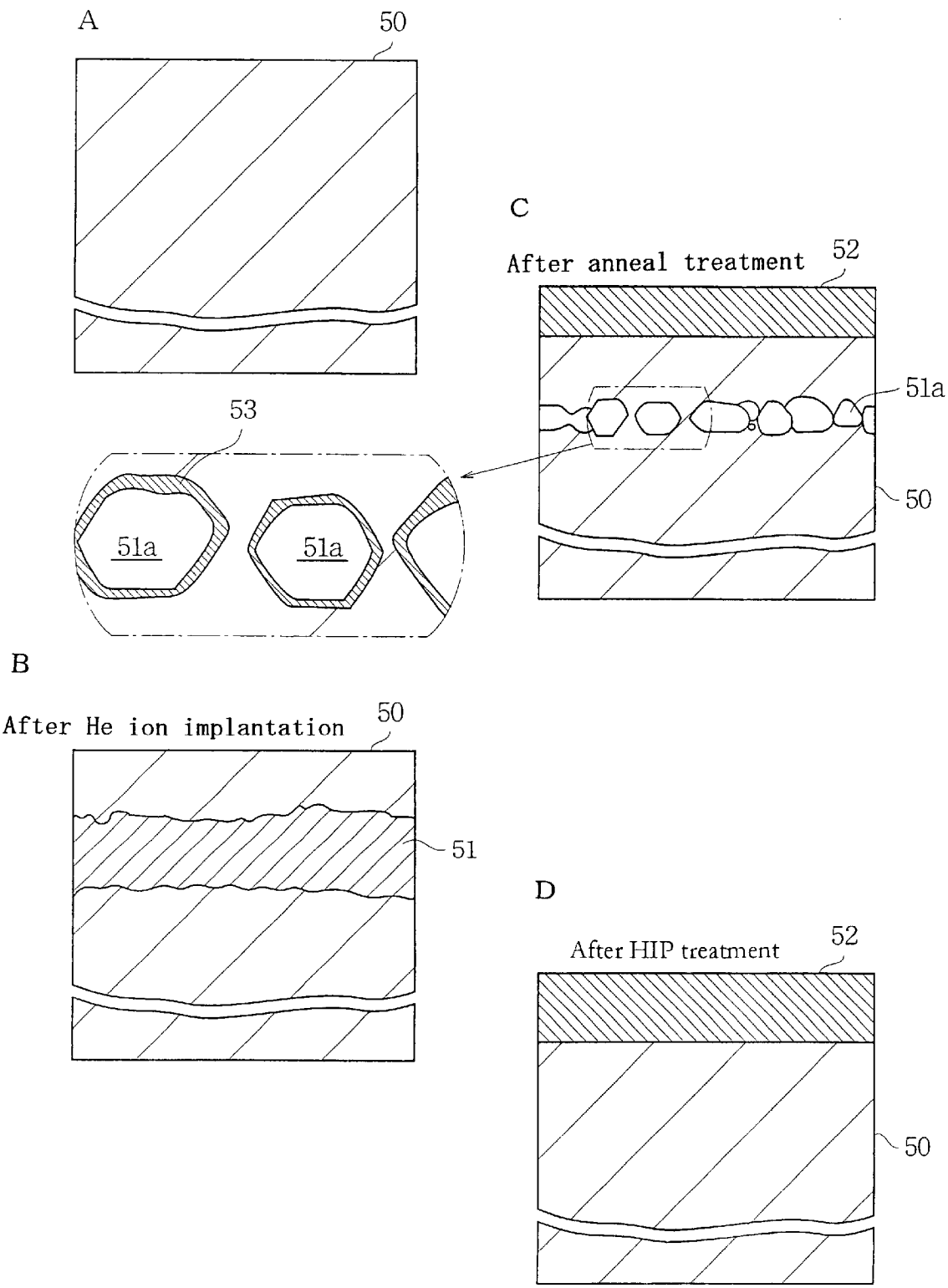
FIG. 5-A is a view schematically showing a silicon single crystal wafer of an Example 1, before implantation of He ions.

Namely, as schematically shown in FIG. 5-A and FIG. 5-B, there were firstly implanted He ions (He$^+$) into a predetermined region of a single crystal wafer 50 of a crystal orientation (100) surface and having a thickness of 625 µm.

Acceleration voltage: 160 keV

Dose amount: $2 \times 10^{17}/cm^2$

Heated temperature of single crystal wafer: 873 K (absolute temperature).

This ion implantation formed an ion implantation damage region 51 at a depth of about 0.5 µm from the surface of a silicon single crystal wafer 10. Within this region 51, silicon atoms at certain lattice positions were launched and turned to be interstitial silicon atoms, resulting in formation of a lot of vacancies at such lattice positions. After the ion implantation, the single crystal wafer 50 was anneal treated in an atmosphere of oxygen (100%) at 1,663 K (absolute temperature) for 2 hours, to thereby aggregate the vacancies into voids 51a. This single crystal wafer 50 was provided as the Example 1.

EXAMPLE 2

The silicon single crystal wafer in the Example 1 formed with voids by conducting the ion implantation and anneal treatment was immersed into a hydrofluoric acid aqueous solution at a concentration of 10 wt. %, to thereby remove a silicon oxide at the surface of the single crystal wafer. This single crystal wafer was provided as the Example 2.

EXAMPLE 3

As the single crystal body 11, there was adopted a block having a diameter of 100 mm and a thickness of 100 mm which was machined from a silicon single crystal ingot. This single crystal block 11 was housed in the HIP apparatus 12 having a diameter of 125 mm and a height of 250 mm for processing. Heaters 18 made of molybdenum were provided within this HIP apparatus 12 at upper and lower zones. The HIP apparatus 12 had an upper limit of 1,723 K (absolute temperature) for its service temperature and could be pressurized up to 200 MPa at the maximum. Argon gas was used as a pressure medium gas. The ingot 11 was housed in the HIP apparatus 12 in such a state that: the ingot 11 was placed on the support 17 made of silicon carbide (SiC) and having an outer diameter of 100 mm, and then wholly covered by the container 21 made of SiC and having an inner diameter of 110 mm, a thickness of 3 mm and a length of 280 mm. Upon HIP treatment, the block 22 made of pure titanium was placed between the support 17 made of SiC and the single crystal block 11, so as to getter such as oxygen within the container 21 upon high temperature heating.

After setting the single crystal ingot 11 within the HIP apparatus 12, the interior of the HIP apparatus 12 was vacuumed, followed by 2 times of substitutional operations by argon gas at about 1 MPa, to thereby complete a pre-treatment. Next, argon gas was introduced into the HIP apparatus 12, and the interior of the HIP apparatus 12 was pressurized to 200 MPa and the heater 18 was simultaneously energized and heated to an absolute temperature of 1,450 K [which is 0.857 times the melting point (1,690 K) of a silicon single crystal]. This condition was kept for 20 hours. After kept, the single crystal ingot 11 was naturally cooled (annealed) within the apparatus 12 until the temperature within the apparatus 12 fell down to 573 K (absolute temperature) or lower, followed by release of the argon gas to thereby bring back the interior of the apparatus 12 to the atmospheric pressure, and the single crystal ingot 11 was then taken out of the apparatus 12. This single crystal ingot 11 was provided as the Example 3.

EXAMPLE 4

In the HIP treatment, after introducing argon gas, the interior of the HIP apparatus was pressurized to 100 MPa and the heater was simultaneously energized to thereby heat the interior of the apparatus to an absolute temperature of 1,530 K (which is 0.905 times the melting point of a silicon single crystal). This condition was kept for 2 hours. This provided a silicon single crystal ingot, while setting the remaining conditions identically with the Example 3. This ingot was provided as the Example 4.

EXAMPLE 5

As a single crystal body, there was used a silicon single crystal wafer having an outer diameter of 100 mm and a thickness of 0.525 mm. Further, in the HIP treatment, after introducing argon gas, the interior of the HIP apparatus was pressurized to 100 MPa and the heater was simultaneously energized to thereby heat the interior of the apparatus to an absolute temperature of 1,530 K (which is 0.905 times the melting point of a silicon single crystal). This condition was kept for 1 hour. This provided a silicon single crystal wafer, while setting the remaining conditions identically with the Example 3. This wafer was provided as the Example 5.

EXAMPLE 6

As a single crystal body, there was used a silicon single crystal wafer having an outer diameter of 100 mm and a thickness of 0.525 mm. Further, in the HIP treatment, after introducing argon gas, the interior of the HIP apparatus was pressurized to 10 MPa and the heater was simultaneously energized to thereby heat the interior of the apparatus to an absolute temperature of 1,530 K (which is 0.905 times the melting point of a silicon single crystal). This condition was kept for 2 hours. This provided a silicon single crystal wafer, while setting the remaining conditions identically with the Example 3. This wafer was provided as the Example 6.

Comparative Example 1

In the HIP treatment, after introducing argon gas, the interior of the HIP apparatus was pressurized to 200 MPa and the heater was simultaneously energized to thereby heat the interior of the apparatus to an absolute temperature of 1,400 K (which is 0.828 times the melting point of a silicon single crystal). This condition was kept for 20 hours. This provided a silicon single crystal ingot, while setting the remaining conditions identically with the Example 3. This ingot was provided as the Comparative Example 1.

Comparative Example 2

As a single crystal body, there was used a silicon single crystal wafer having an outer diameter of 100 mm and a thickness of 0.525 mm. Further, in the HIP treatment, after introducing argon gas, the interior of the HIP apparatus was pressurized to 0.15 MPa and the heater was simultaneously energized to thereby heat the interior of the apparatus to an absolute temperature of 1,530 K (which is 0.905 times the melting point of a silicon single crystal). This condition was kept for 2 hours. This provided a silicon single crystal wafer, while setting the remaining conditions identically with the Example 3. This wafer was provided as the Comparative Example 2.

Comparative Example 3

As a single crystal body, there was used a silicon single crystal wafer having an outer diameter of 100 mm and a thickness of 0.525 mm. Further, in the HIP treatment, after introducing argon gas, the interior of the HIP apparatus was kept at the atmospheric pressure and the heater was simultaneously energized to thereby heat the interior of the apparatus to an absolute temperature of 1,530 K (which is 0.905 times the melting point of a silicon single crystal). This condition was kept for 1 hour. This provided a silicon single crystal wafer, while setting the remaining conditions identically with the Example 3. This wafer was provided as the Comparative Example 3.

Comparative Example 4

As a single crystal body, there was used a silicon single crystal wafer having an outer diameter of 100 mm and a thickness of 0.525 mm. This silicon single crystal wafer was directly placed on the lower lid without using the support made of SiC and without using the block made of pure titanium, and this wafer was set within the HIP apparatus without using the container made of SiC. Further, in the HIP treatment, after introducing argon gas, the interior of the HIP apparatus was pressurized to 100 MPa and the heater was simultaneously energized to thereby heat the interior of the apparatus to an absolute temperature of 1,530 K (which is 0.905 times the melting point of a silicon single crystal). This condition was kept for 1 hour. This provided a silicon single crystal wafer, while setting the remaining conditions identically with the Example 3. This wafer was provided as the Comparative Example 4.

Comparative Test 1 and Evaluation

Figure 6:
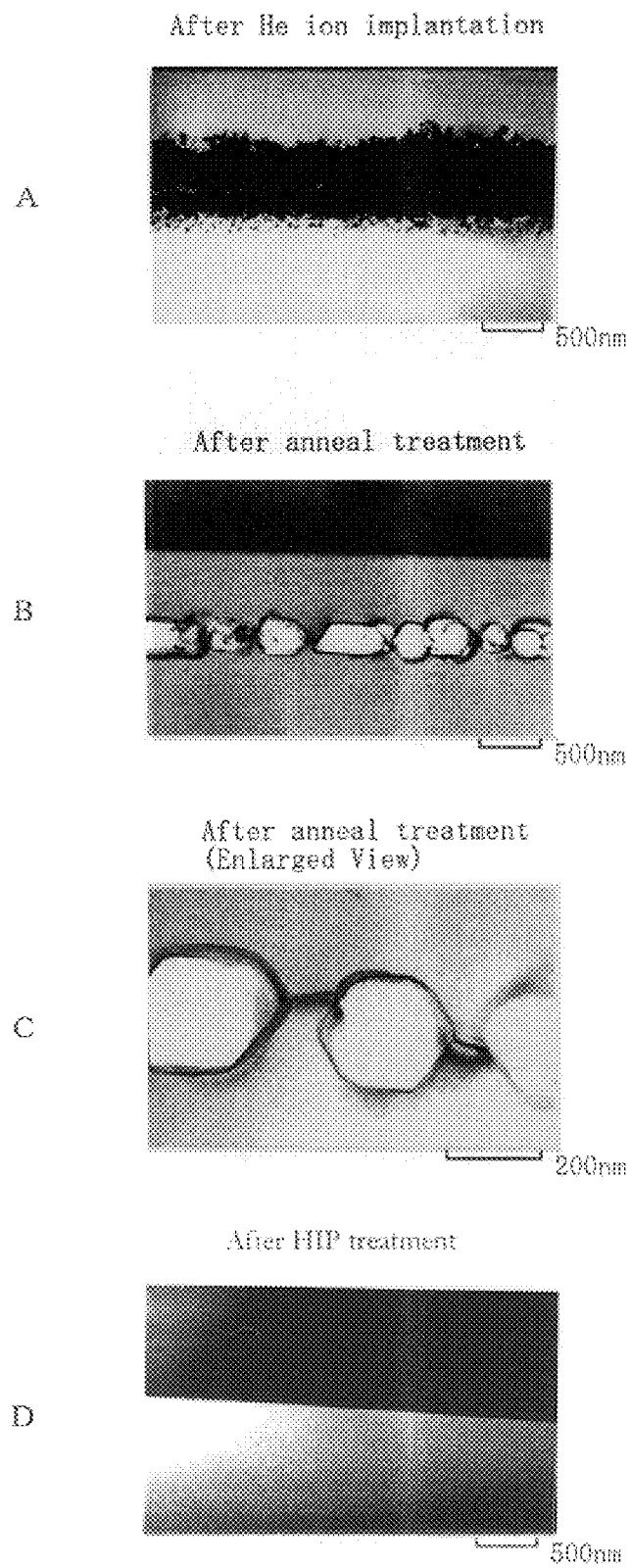
FIG. 6-A is an electron micrograph (about×18,000) of a cross section of the silicon single crystal wafer of the Example 1 after the implantation of He ions and before the anneal treatment.

Observation of the single crystal wafer 50 of the Example 1 by a transmission electron microscope showed formation of a silicon oxide having a thickness of about 600 nm at the single crystal wafer surface as shown in FIG. 6-A through FIG. 6-C, in which a lot of voids were formed in the ion implantation damage region, each void having a silicon oxide of a thickness of several nm at the inner surface of the void. This situation is schematically shown in FIG. 5-C. Oxygen atoms diffused into the single crystal wafer 50 based on diffusion control while forming a silicon oxide 52 at the single crystal wafer surface. Those oxygen atoms diffused up to this ion implantation damage region 51 formed silicon oxides 53 at the inner surfaces of the voids 51a. The voids 51a and the silicon oxides 53 are schematically shown in an enlarged view encircled by a dashed line in FIG. 5-C.

Thereafter, the silicon single crystal wafer 50 having been formed with the voids 51a by the ion implantation and the anneal treatment was HIP treated under the condition shown in Table 1. This single crystal wafer 50 was observed by a transmission electron microscope. Further, the single crystal wafer of the Example 2 was also HIP treated identically with the above, and then observed by a transmission electron microscope. The result is shown in Table 1.

TABLE 1

|  | Single Crystal Wafer | | Condition upon HIP treatment | | | | Number of defects |
|---|---|---|---|---|---|---|---|
|  | Thickness (mm) | Silicon oxide at surface | Temp. (K.) | Pressure (MPa) | Time (h) | Atmosphere |  |
| Example 1 | 0.625 | Present | 1473 | 5.07 | 1 | Mix. of Ar and $O_2$ (less than 10%) | 0 |
| Example 2 | 0.625 | Absent | 1473 | 5.07 | 1 | Mix. of Ar and $O_2$ (less than 10%) | 0 |

As apparent from Table 1 and FIG. 6-D, those voids within the single crystal wafer of the Example 1 had been fully expelled, and the silicon oxide 52 at the single crystal wafer surface had increased to about 900 nm. This situation is schematically shown in FIG. 5-D. Meanwhile, those voids within the single crystal wafer of the Example 2 had been also fully expelled, identically with the Example 1.

Comparative Test 2 and Evaluation

Those silicon single crystal blocks of the Examples 3 and 4 and the Comparative Example 1 were machined into wafers and polished, followed by etching so as to expose pits therein, if any. Further, those silicon single crystal wafers from the Examples 5 and 6 and the Comparative Examples 2 and 3 were tested for internal vacancy defects, by a method for transmitting infrared light into each wafer from its side surface so as to detect the infrared light scattered from those defects existing within the wafer in the direction perpendicular to the surface. The numbers of defects at the surfaces and interiors of respective wafers were confirmed by the aforementioned method. The result is shown in Table 2.

TABLE 2

| | Dimension of single crystal body | | Condition upon HIP treatment | | | | Number of defects | |
|---|---|---|---|---|---|---|---|---|
| | Diameter (mm) | Thickness (mm) | Temp. (K.) | Pressure (MPa) | Time (h) | Container Material | Surface | Interior |
| Example 3 | 100 | 100 | 1450 | 200 | 20 | SiC | 4 | 6 |
| Example 4 | 100 | 100 | 1530 | 100 | 2 | SiC | 0 | 0 |
| Example 5 | 100 | 0.525 | 1530 | 100 | 1 | SiC | 4 | 0 |
| Example 6 | 100 | 0.525 | 1530 | 10 | 2 | SiC | 6 | 10 |
| Comp. Ex. 1 | 100 | 100 | 1400 | 200 | 20 | SiC | 50 to 60 | 100 or more |
| Comp. Ex. 2 | 100 | 0.525 | 1530 | 0.15 | 2 | SiC | 100 or more | 100 or more |
| Comp. Ex. 3 | 100 | 0.525 | 1530 | Atmospheric | 2 | SiC | 100 or more | Too many to count |
| Comp. Ex. 4 | 100 | 0.525 | 1530 | 100 | 1 | none | Too coarse to detect | unmeasurable |

As apparent from Table 2, the Example 3 had extremely less surface defects and interior defects which are at practically useful levels, since the treatment time was relatively long 20 hours in view of the relatively lower temperature of 1,450 K upon HIP treatment. Contrary, the Comparative Example 1 had surface defects detected at the level of several tens pieces and interior defects detected at a more increased level even by the prolonged treatment time of 20 hours, because the temperature upon HIP treatment was as low as 1,400 K.

The Example 4 had substantially no defects even with the treatment time which was as short as 2 hours, because the temperature upon HIP treatment was as high as 1,530 K and the treatment pressure was relatively high as 100 MPa so that defects had been expelled substantially perfectly. Contrary, the Comparative Example 2 had surface defects and interior defects both detected at the levels of 100 pieces or more, because the pressure upon HIP treatment was as low as 0.15 MPa.

Both of the Examples 5 and 6 had such defects at practically useful levels, since thin silicon single crystal wafers were used for them in view of the short time of HIP treatment. In detail, only a few defects were partly detected at the respective surfaces due to contamination upon HIP treatment, but no defects were detected within the wafers. Contrary, the Comparative Example 3 was flooded with defects not only at the surface but also at the interior, because the pressure upon HIP treatment was as low as the atmospheric pressure even with the same temperature as the Examples 5 and 6. It is assumed that defects were increased rather than decreased, upon HIP treatment.

Further, the Comparative Example 4 was too rough to test at its surface due to remarkable contamination from constituent elements of the treatment chamber of the HIP apparatus, since the wafer of this Comparative Example 4 was directly placed on the lower lid and directly placed within the HIP apparatus without the support made of SiC, without the block made of pure titanium, and without the container made of SiC, and since the treatment temperature was so high, though the temperature, pressure and time upon HIP treatment were identical with those in the Example 5. The interior of the Comparative Example 4 was also too rough to test, due to remarkable affection of contamination from the surface.

According to the present invention as described above, there has been conducted the hot isostatic pressing treatment for a single crystal body in an atmosphere where the single crystal body is stable, under a pressure of 0.2 to 304 MPa at a temperature which is 0.85 or more times the melting point in an absolute temperature unit of the single crystal body, for 5 minutes to 20 hours, and the single crystal body is thereafter annealed. Thus, those lattice defects such as vacancy type grown-in defects existing at the surface and within the interior of the single crystal body are crushed such that those atoms constituting the single crystal body are re-arranged, resulting in an excellent effect providing a high quality single crystal body in which the lattice defects such as vacancy type grown-in defects are expelled or dispersed.

As a result, substrate materials indispensable to LSI production are turned to be high quality ones free of defects, thereby largely contributing to a production yield thanks to the reduction of off-spec products, and thus contributing to the reduction of the production cost of LSI's. Further, it becomes possible to produce a high quality single crystal without prolonging the single crystal growth time in single crystal ingot production which is a previous step of single crystal wafer production, thereby largely contributing to shortening of the single crystal growth time, securement of a quality and improvement of yield, particularly in the production of a silicon ingot of a larger diameter to be much expected hereafter.

INDUSTRIAL APPLICABILITY

The defect eliminating method of a single crystal body of the present invention and the single crystal body defect-eliminated by the method can be utilized to produce a single crystal body for a high quality semiconductor such as used for a substrate of an integrated circuit or device, by conducting the specific treatment for a single crystal body produced by a conventional single crystal producing method to thereby eliminate at a lattice defect level those lattice defects caused during growth of the single crystal body.

What is claimed is:

1. A method for eliminating defects in a silicon single crystal body, comprising the steps of:
    subjecting the hot isostatic single crystal body to a hot isostatic pressing treatment in an atmosphere in which the silicon single crystal body is stable and under a pressure of 0.2 to 304 MPa at a temperature which is at least 85 percent of times the melting point of the silicon single crystal body in degrees absolute, for 5 minutes to 20 hours; and
    annealing the thus treated single crystal body.

2. The method of claim 1, wherein the atmosphere for the hot isostatic pressing treatment is an inert gas atmosphere or an atmosphere containing vapor of a high vapor pressure element.

3. The method of claim 2, wherein said hot isostatic pressing treatment is conducted under a pressure of 10 to 200 MPa.

4. A defect free silicon single crystal body obtained by the method of claim 3.

5. The method of claim 2, wherein the silicon single crystal is an ingot of a silicon single crystal, or a block or wafer obtained by slicing the ingot.

6. A defect free silicon single crystal body obtained by the method of claim 5.

7. A defect free silicon single crystal body obtained by the method of claim 2.

8. The method of claim 1, wherein said hot isostatic pressing treatment is conducted under a pressure of 10 to 200 MPa.

9. The method of claim 8, wherein the silicon single crystal is an ingot of a silicon single crystal or a block or wafer obtained by slicing the ingot.

10. A defect free silicon single crystal body obtained by the method of claim 9.

11. A defect free silicon single crystal body obtained by the method of claim 8.

12. The method of claim 1, wherein the silicon single crystal is an ingot of a silicon single crystal or a block or wafer obtained by slicing the ingot.

13. A defect free silicon single crystal body obtained by the method of claim 12.

14. A defect free silicon single crystal body obtained by the method of claim 1.

* * * * *